(12) United States Patent
Nishiwaki et al.

(10) Patent No.: US 7,791,001 B2
(45) Date of Patent: Sep. 7, 2010

(54) AUTOMATIC FOCUSING APPARATUS, LASER PROCESSING APPARATUS, AND LASER CUTTING APPARATUS

(75) Inventors: Masayuki Nishiwaki, Yoshikawa (JP); Junichiro Iri, Yokohama (JP); Genji Inada, Kawasaki (JP); Sadayuki Sugama, Tsukuba (JP)

(73) Assignee: Canon Kabushiki Kaisha, Tokyo (JP)

( * ) Notice: Subject to any disclaimer, the term of this patent is extended or adjusted under 35 U.S.C. 154(b) by 1331 days.

(21) Appl. No.: 11/280,886

(22) Filed: Nov. 15, 2005

(65) Prior Publication Data

US 2006/0109757 A1 May 25, 2006

(30) Foreign Application Priority Data

Nov. 19, 2004 (JP) ............................. 2004-335396

(51) Int. Cl.
*B23K 26/00* (2006.01)
*B23K 26/04* (2006.01)

(52) U.S. Cl. .............................. 219/121.68; 219/121.83

(58) Field of Classification Search .................................
219/121.61–121.72, 121.76, 121.78, 121.81,
219/121.83, 121.85
See application file for complete search history.

(56) References Cited

U.S. PATENT DOCUMENTS

| | | | | |
|---|---|---|---|---|
| 5,144,358 A | * | 9/1992 | Tsuru et al. | 396/50 |
| 5,358,806 A | * | 10/1994 | Haraichi et al. | 430/5 |
| 6,084,697 A | * | 7/2000 | Lebby et al. | 359/202.1 |
| 6,411,838 B1 | * | 6/2002 | Nordstrom et al. | 600/476 |
| 6,974,938 B1 | * | 12/2005 | Leblans et al. | 250/201.3 |
| 7,016,110 B2 | * | 3/2006 | Leblans | 359/391 |
| 2004/0002199 A1 | | 1/2004 | Fukuyo | |
| 2005/0173387 A1 | | 8/2005 | Fukuyo | |
| 2005/0181581 A1 | | 8/2005 | Fukuyo | |
| 2005/0184037 A1 | | 8/2005 | Fukuyo | |
| 2005/0189330 A1 | | 9/2005 | Fukuyo | |
| 2005/0194364 A1 | | 9/2005 | Fukuyo | |
| 2006/0289410 A1 | * | 12/2006 | Morita et al. | 219/121.67 |

FOREIGN PATENT DOCUMENTS

| | | | | |
|---|---|---|---|---|
| JP | 362296987 A | * | 12/1987 | |
| JP | 405196418 A | * | 8/1993 | |
| JP | 2001305420 A | * | 10/2001 | |
| JP | 2002-192370 A | | 7/2002 | |
| JP | 2002-205180 A | | 7/2002 | |

* cited by examiner

*Primary Examiner*—Samuel M Heinrich
(74) *Attorney, Agent, or Firm*—Canon U.S.A.., Inc., IP Division

(57) ABSTRACT

At least one exemplary embodiment is directed to a laser processing apparatus that can use the shape of a plurality of reflected light fluxes to adjust the position of workpiece relative to an optical system, where the laser processing apparatus facilitates both the viewing of the workpiece and a focusing of a processing laser into the workpiece.

6 Claims, 10 Drawing Sheets

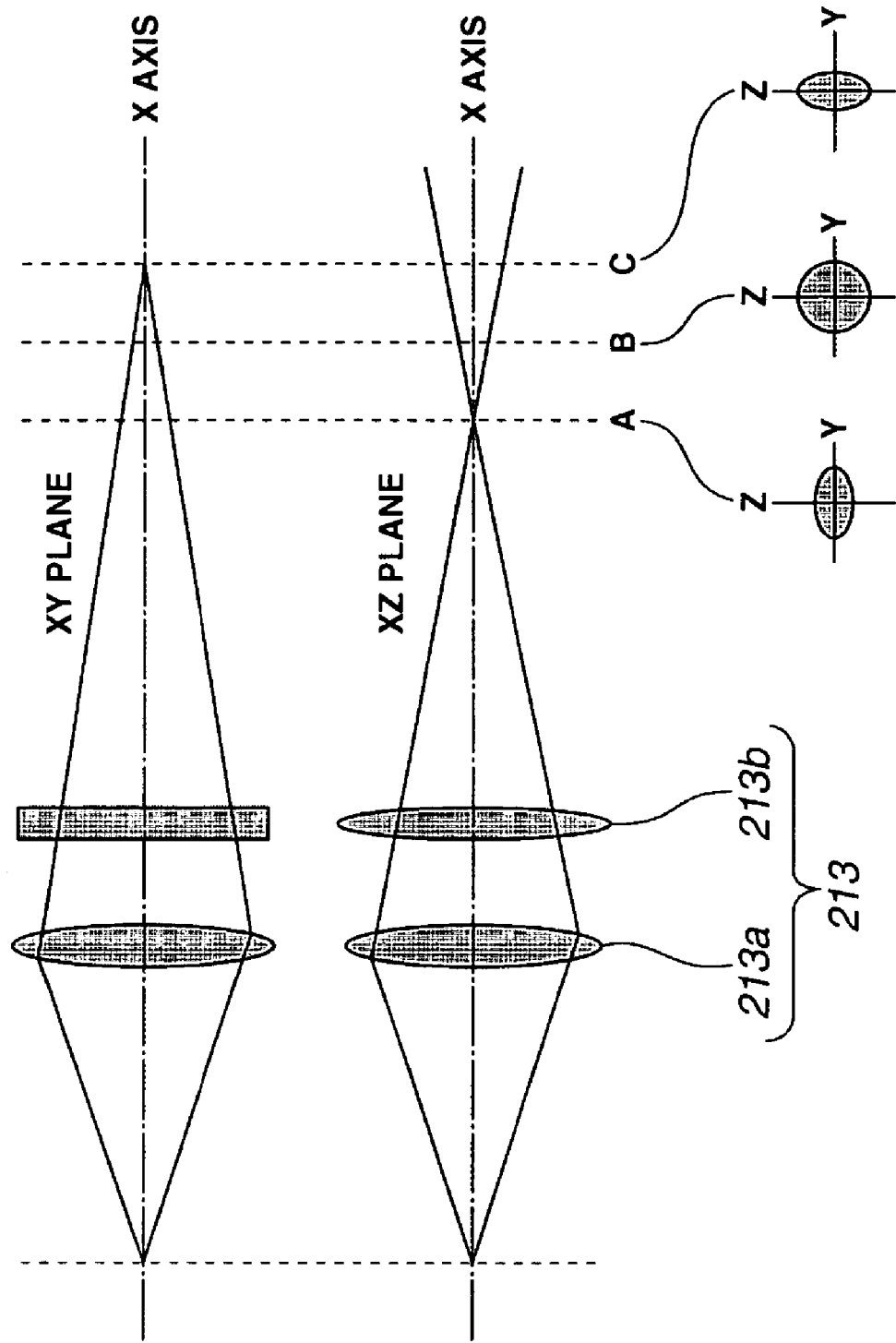

AUTOMATIC FOCUSING APPARATUS, LASER PROCESSING APPARATUS, AND LASER CUTTING APPARATUS

BACKGROUND OF THE INVENTION

1. Field of the Invention

The present invention relates to an automatic focusing apparatus, and more particularly, although not exclusively, to an automatic focusing apparatus for an optical system that irradiates a surface to be processed or machined with a light flux of a light source.

2. Description of the Related Art

Conventionally, in processing a workpiece by irradiating its surface with a laser beam, it is occasionally required to confirm the position of the irradiating point of the laser beam or required to observe the processed condition of the workpiece. Furthermore, condensing the laser beam for processing the workpiece may be required. When such a processing operation is carried out, a focus adjustment relative to a surface which is irradiated with the laser beam can be performed for an optical system used for observation or for an optical system used for laser processing. Furthermore, to improve the efficiency of the laser processing operation, an automatic focusing apparatus for automatically adjusting focus is provided.

The automatic focusing method can be employed to directly measure the distance between the optical system (i.e. an objective lens) and the laser beam receiving surface. In such a case, in view of improving the accuracy in the automatic focusing adjustment, measurement of the distance between the optical system (i.e., an objective lens) and the laser beam receiving surface may be done at the position close to the portion where the processing operation using the laser beam is performed. Furthermore, in recent years, the processing method uses a laser beam to cut a substrate by condensing the laser beam inside the substrate at a plurality of regions of the substrate surface.

As one example, a silicon wafer or other semiconductor substrate is required to be accurately cut into chip pieces. Conventionally, a substrate is cut by rotating, at a high speed, a circular blade having a width of several tens µm to several hundreds µm so that the abrasive material on the blade surface can grind the substrate. This method is generally referred to as a blade dicing method.

According to this method, to reduce heat generation or abrasion during the cutting operation, it is usual to spray cooling water on the cut surface. In such a case, parts of the substrate or fine particles of abrasive material generated during the cutting operation can be mixed in the cooling water with other waste such as adhesive particles of an adhesive tape used to fix the substrate to a processing table and can spread in a wide region.

Especially, in a case where the substrate is a semiconductor substrate, numerous fine functional elements are formed on the substrate surface. Reliability of these functional elements can be greatly lessened.

To address these issues, one can perform the cutting operation in a dry environment without using the cooling water. To this end, to cut the substrate, a processing method using a laser beam having a wavelength highly absorbable by the substrate can be employed to condense the laser beam on the substrate surface.

However, according to this method, not only the portion directly irradiated with the laser beam but also its peripheral portion on the substrate surface can melt. The logic circuits on the semiconductor substrate can be damaged. Furthermore, the process of laser processing operation progresses from an incident side of the laser beam to an exiting side so that melting of the substrate successively occurs. Accordingly, fine particles in a molten state will soon and successively harden and remain as dust particles on the substrate surface. In this respect, like the above-described blade dicing operation, the laser processing operation is not free from the problem of dusts.

To address such problems, Japanese Patent Application Laid-open No. 2002-192370 and Japanese Patent Application Laid-open No. 2002-205180 discuss a processing method that uses a laser beam highly absorbable by a substrate so that the substrate is cut by utilizing internal beam-condensing of the laser beam.

More specifically, a laser beam having a specific wavelength that shows high permeability relative to a substrate, i.e., a material to be processed, is used to condense the laser beam inside the substrate, thereby setting a start point of the cutting operation in a predetermined internal region of the substrate. This processing method can realize an excellent cutting operation accompanied with less waste because no melt region is formed on the substrate surface. According to an apparatus for processing or cutting a workpiece or a substrate by utilizing the irradiation of such a processing laser beam, the laser beam is condensed inside the substrate via a microscope objective lens that is used for observing a processing position. The laser processing operation is performed by driving the substrate with a stage or comparable actuator along a predetermined processing line or a predetermined cutting line while keeping the internal beam-condensing condition of the laser beam.

To perform the above-described operation using a laser beam for processing a workpiece or cutting a substrate, one can continuously observe the condition of the laser beam irradiating the substrate surface with an objective lens during a processing or cutting operation of the surface to be irradiated (i.e., a laser beam receiving region which is irradiated with the laser beam).

However, the objective lens used in this case is also used for irradiating the laser beam receiving region with the laser beam or for condensing the laser beam. In other words, it can become necessary to simultaneously satisfy two conditions, i.e., a condition for observing the substrate surface being processed and a condition for controlling the irradiation or condensing of the laser beam.

However, according to the above-described automatic focusing apparatus or the laser processing apparatus, the material of the surface to be processed tends to soften, melt, or deform during a laser beam processing operation due to irradiation of the laser beam, at the center of the optical axis of an irradiation optical system that provides a processing laser beam (i.e., at the processed surface irradiated with the laser beam).

Therefore, if the position including the center of such an optical axis is regarded as a reference position for the distance measurement performed by the automatic focusing apparatus, it is difficult to accurately measure the distance between the optical system (i.e., an objective lens) and the laser beam receiving surface.

Moreover, the above-described laser cutting apparatus can form an internal processing region inside the substrate, and accordingly there is no intent to directly process the substrate surface. However, it is the fact that the region including the center of the optical axis of the processing laser beam is irradiated with the processing laser beam when this laser beam is condensed inside the substrate. Thus, the substrate surface corresponding to the above region is somewhat processed. This is one reason why one may not want to designate the central portion of the optical axis as a substrate-side reference position for the distance measurement performed by an automatic focusing apparatus.

SUMMARY OF THE INVENTION

At least one exemplary embodiment is directed to an automatic focusing apparatus for an optical system that irradiates a surface to be processed or machined with a light flux of a light source. Where the automatic focusing apparatus can be used with a laser processing apparatus, that is associated with the automatic focusing apparatus to perform the processing of a workpiece with irradiation of a laser beam, and a laser cutting apparatus that performs cutting of a substrate.

At least one exemplary is directed to an automatic focusing apparatus that can be configured to perform a distance measurement even in a case where a reflected light flux from an incident laser beam focused on a position on a light receiving region has the position designated as being inappropriate as being used as a distance measuring reference. Furthermore, at least one exemplary embodiment is directed to a laser processing apparatus and a laser cutting apparatus that facilitate performing an automatic focusing adjustment while performing a laser processing operation, in a condition that a shared objective lens is used for a processing laser beam and a focus adjusting laser beam directed to a light receiving region.

In at least one further exemplary embodiment, an automatic focusing apparatus includes a first optical system, a second optical system, and an output unit. The first optical system, can be an optical system that irradiates a light receiving surface with a light flux supplied from a light source, and provides light paths of a plurality of light fluxes where the plurality of light fluxes can be positioned around an optical axis of the first optical system when the light fluxes are incident on the light receiving surface. The second optical system guides the light fluxes reflected from the light receiving surface to a photo-sensitive unit that detects the reflected-light fluxes. The output unit outputs information relating to condensing conditions of the light fluxes condensed on the light receiving surface, based on the plurality of light fluxes reflected from the light receiving surface and detected by the photo-sensitive unit.

At least one further exemplary embodiment is directed to a laser processing apparatus that irradiates a workpiece with a processing laser beam to process the workpiece and includes a first optical system, a second optical system, a third optical system, a fourth optical system, an objective lens, and an output unit. The first optical system, can be an optical system that emits a focus adjusting laser beam to a laser beam receiving surface of the workpiece, and provides light paths of a plurality of light fluxes as the focus adjusting laser beam where the plurality of light fluxes can be positioned around an optical axis of the first optical system when the laser beam is incident on the laser beam receiving surface. The second optical system guides the plurality of light fluxes reflected from the laser beam receiving surface to a photo-sensitive unit that detects the reflected light fluxes. The third optical system is configured to irradiate the laser beam receiving surface of the workpiece with the processing laser beam. The fourth optical system is configured to observe the laser beam receiving surface. The objective lens is shared by the first optical system, the second optical system, the third optical system, and the fourth optical system, and is provided to face the laser beam receiving surface. The output unit outputs information relating to beam-condensing conditions of the plurality of light fluxes condensed on the laser beam receiving surface, based on the plurality of light fluxes reflected from the laser beam receiving surface and detected by the photo-sensitive unit.

At least one further exemplary embodiment is directed to a laser processing apparatus that forms, in cutting a substrate, an internal processing region inside the substrate by condensing a processing laser beam at a beam-condensing point located at a predetermined depth from a surface of the substrate. The laser processing apparatus includes a first optical system, a second optical system, a third optical system, a fourth optical system, an objective lens, and an output unit. The first optical system, can be an optical system that emits a focus adjusting laser beam to the substrate surface, provides light paths of a plurality of light fluxes as the focus adjusting laser beam where the plurality of light fluxes can be positioned around an optical axis of the first optical system when the laser beam is incident on the substrate surface. The second optical system guides the plurality of light fluxes reflected from the substrate surface to a photo-sensitive unit that detects the reflected light fluxes. The third optical system has a laser beam condensing position adjusting mechanism to condense the processing laser beam for forming the internal processing region at an internal position inside the substrate. The fourth optical system is configured to observe the substrate surface. The objective lens is shared by the first optical system, the second optical system, the third optical system, and the fourth optical system and is provided to face the substrate surface. The output unit outputs information relating to beam-condensing conditions of the plurality of light fluxes condensed on the substrate surface, based on the plurality of light fluxes reflected from the substrate surface and detected by the photo-sensitive unit.

Further features of at least one exemplary embodiment will become more apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments of the invention. FIGS. 1A to 1D cooperatively illustrate a processing apparatus in accordance with at least one exemplary embodiment, in which FIG. 1A illustrates a schematic diagram showing an arrangement of the processing apparatus, FIG. 1B illustrates a schematic diagram showing details of a beam-condensing optical system, an automatic focusing optical system, and an observing optical system, FIG. 1C illustrates a schematic diagram showing further details of the automatic focusing optical system, and FIG. 1D illustrates a schematic diagram showing laser beam spots on an irradiated surface.

FIGS. 2A and 2B illustrate schematic diagrams explaining an astigmatism method, in which FIG. 2A illustrates a schematic diagram showing image formation on an XY plane realized by a combined lens and FIG. 2B illustrates a schematic diagram showing image formation on an XZ plane realized by the combination lens.

FIGS. 4A to 4C illustrate schematic diagrams cooperatively using a silicon substrate as an example of the substrate, in which FIG. 4A illustrates a perspective view of the silicon substrate, FIG. 4B illustrates a partial perspective view showing part of the silicon substrate shown in FIG. 4A, and FIG.

Figure 4A:
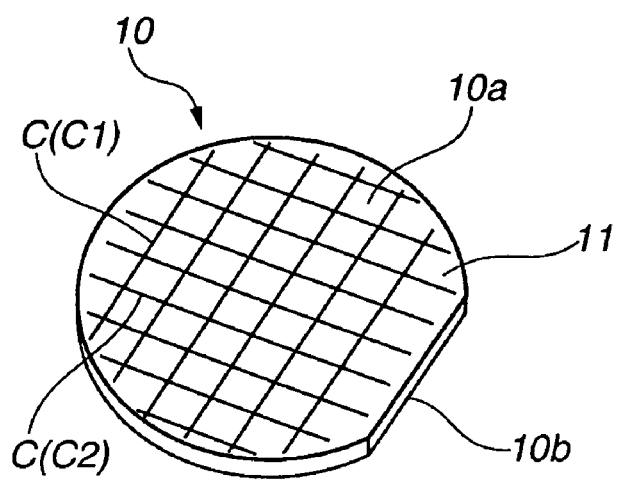
Figure 4B:
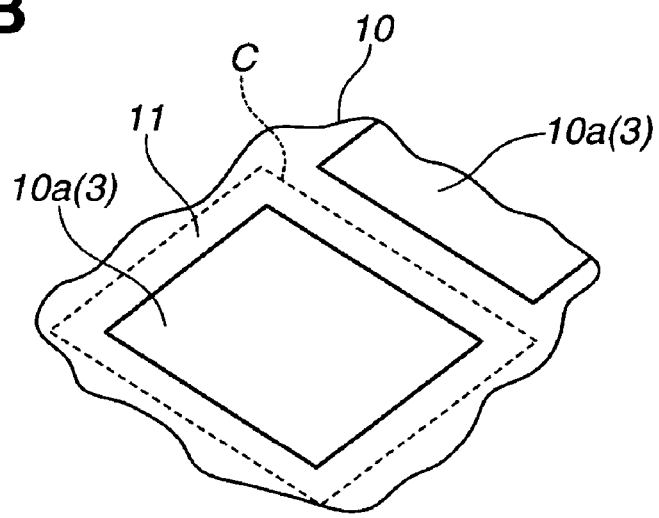

4C illustrates partial cross-sectional view showing a cross section of the silicon substrate shown in FIG. 4B.

Figure 5:
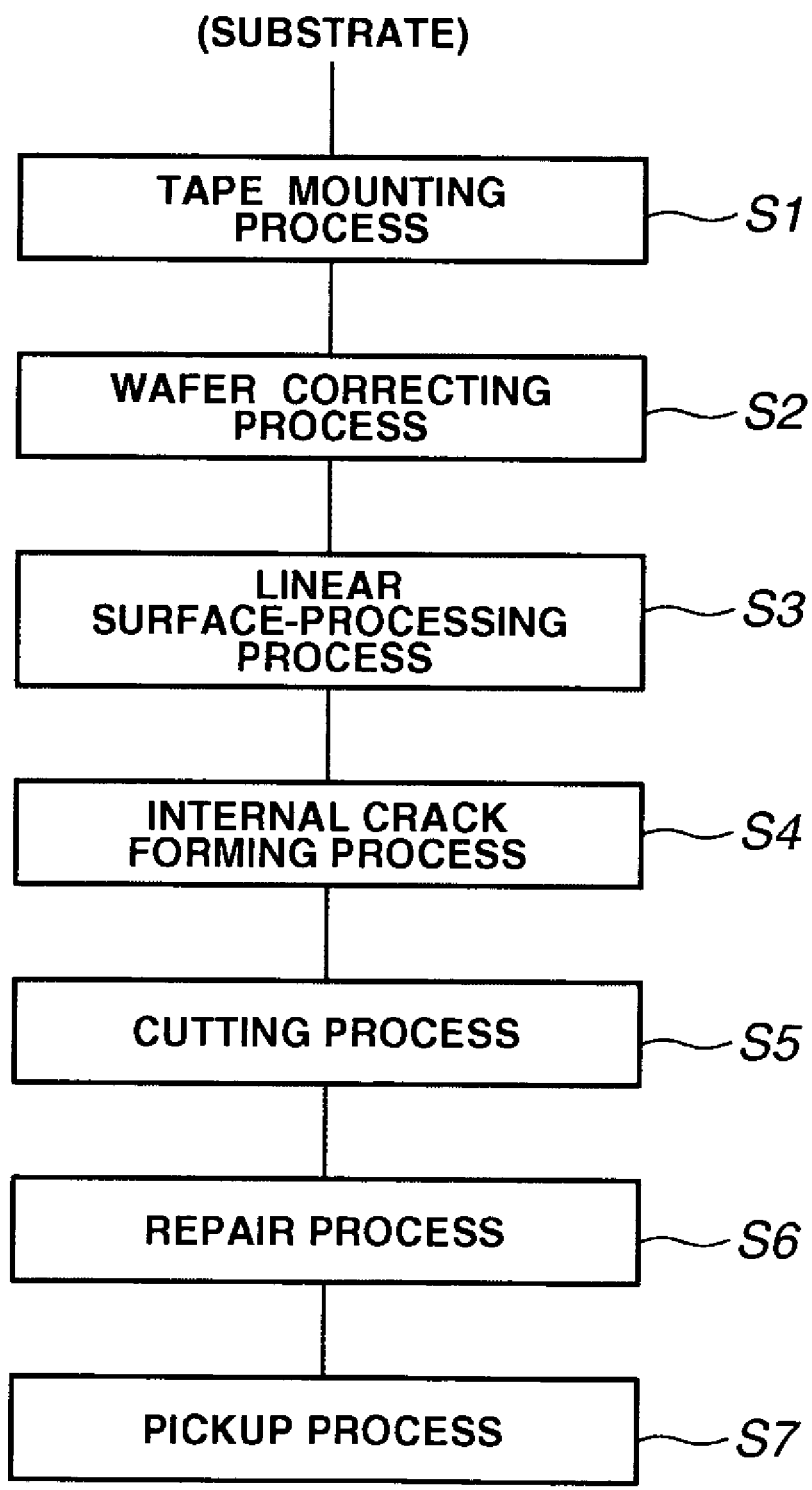

FIG. 5 illustrates a flowchart showing details of a cutting process in accordance with at least one exemplary embodiment.

Figure 6:
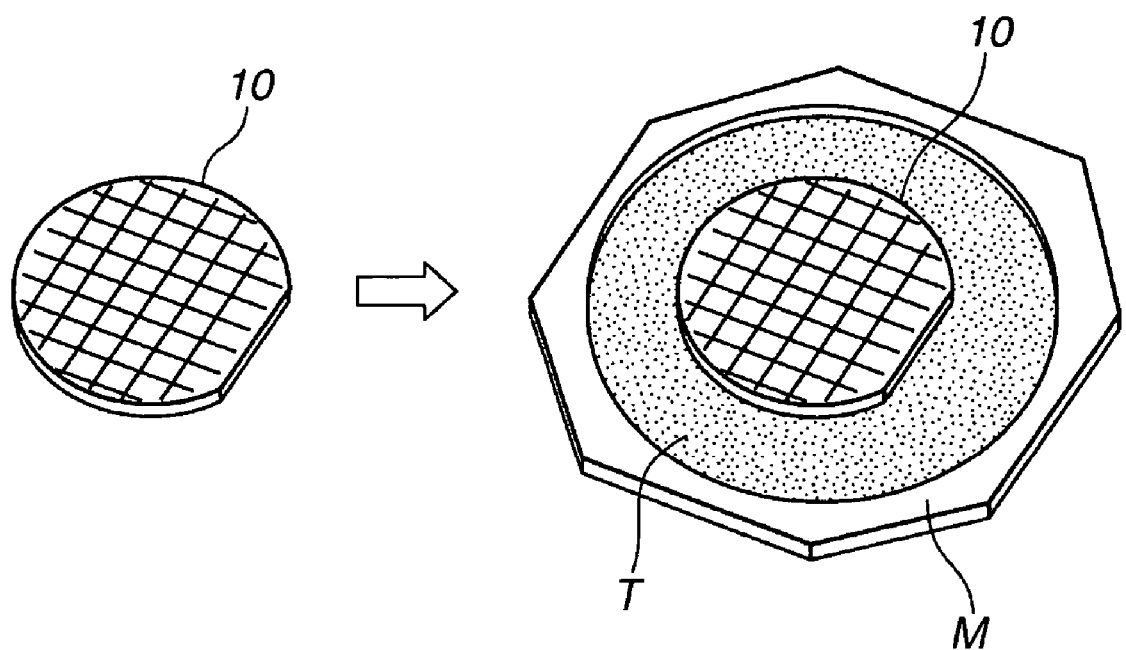

FIG. 6 illustrates a perspective diagram explaining a tape mounting process.

Figure 7A:
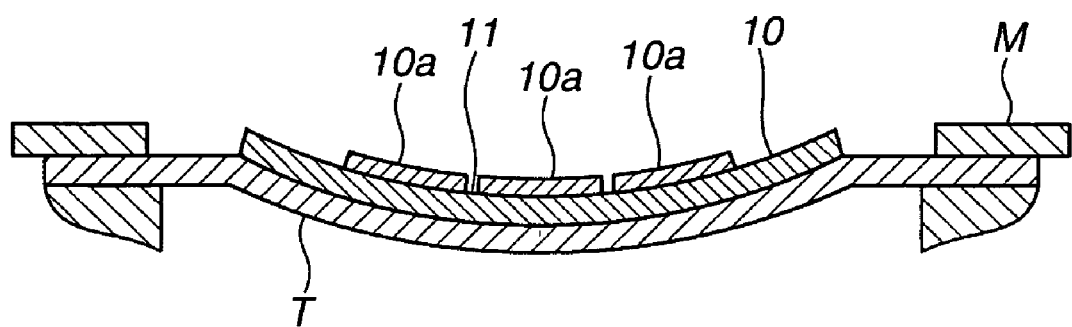
Figure 7B:
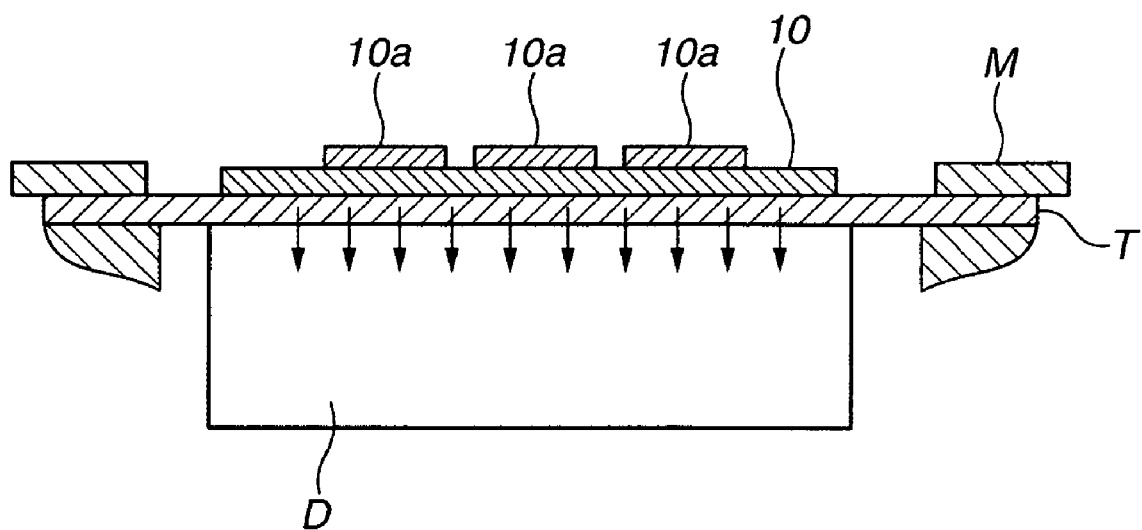

FIGS. 7A and 7B illustrate cross-sectional diagrams explaining a wafer correcting process.

Figure 8:
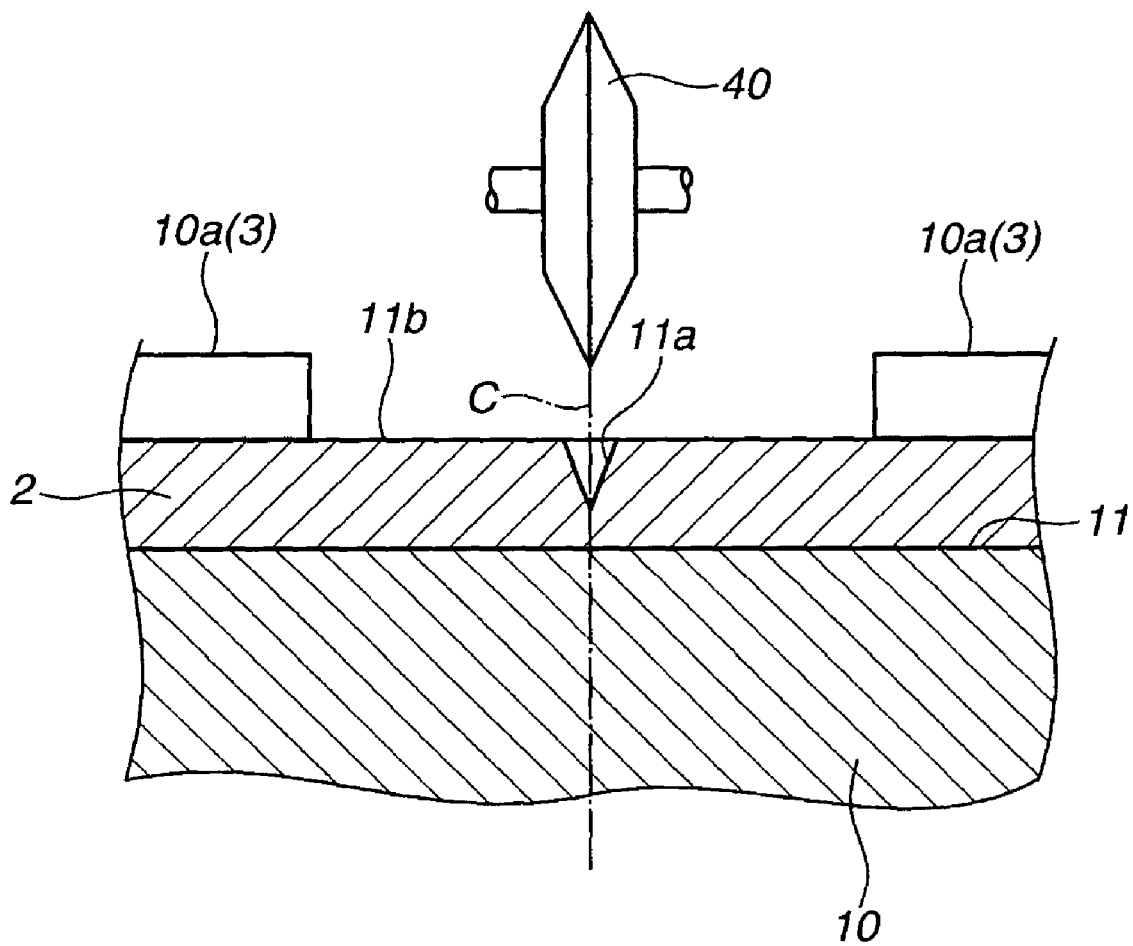

FIG. 8 illustrates a cross-sectional diagram explaining a linear surface-processing operation that forms a surface processing trace.

Figure 9:
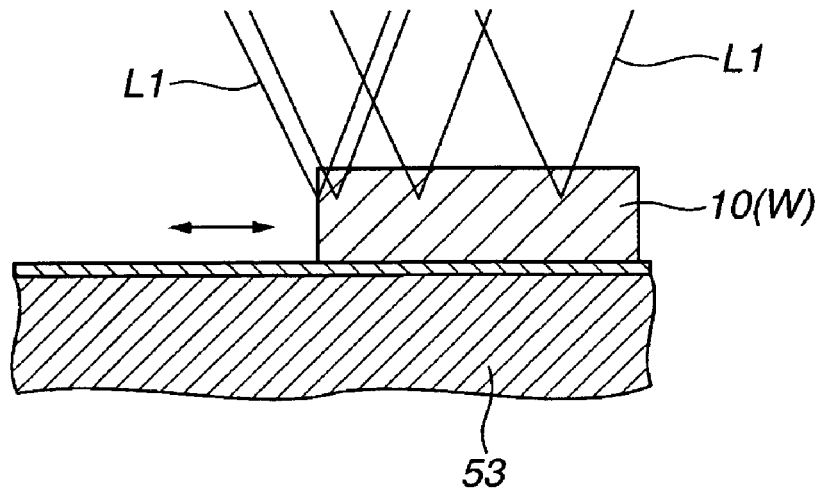

FIG. 9 illustrates a cross-sectional diagram explaining formation of internal cracks at an end region of a substrate.

Figure 10:
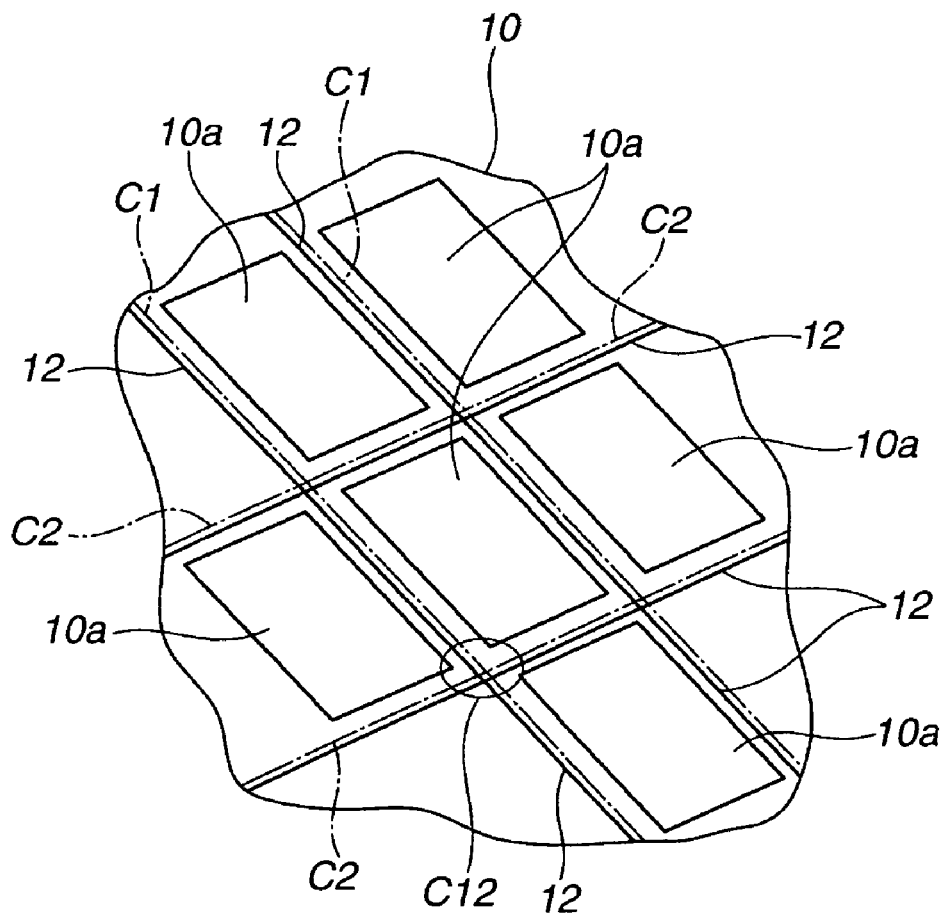

FIG. 10 illustrates a perspective diagram explaining a cutting of a substrate into a plurality of special chips.

FIGS. 11A to 11D illustrate diagrams explaining a scanning method of a laser beam in a case where crack groups differing in the depth are formed.

DETAILED DESCRIPTION OF THE EMBODIMENTS

The following description of exemplary embodiment(s) is/are merely illustrative in nature and is in no way intended to limit the invention, its application, or uses.

Processes, techniques, apparatus, and materials as known by one of ordinary skill in the art may not be discussed in detail but are intended to be part of the enabling description where appropriate. For example certain lasers and optical lens systems may not be discussed in detail. However these systems and the methods to fabricate these system as known by one of ordinary skill in the relevant art is intended to be part of the enabling disclosure herein where appropriate.

Note that similar reference numerals and letters refer to similar items in the following figures, and thus once an item is defined in one figure, it may not be discussed for following figures.

Note that the non-limiting illustrative examples that follow discuss the use of a silicon substrate, however exemplary embodiments are not limited to silicon substrates, the substrate can be made of various materials (e.g., SiO2, other substrate materials as known by one of ordinary skill in the relevant art and equivalents).

Exemplary embodiments will be described in detail with reference to the attached drawings.

Figure 1A:
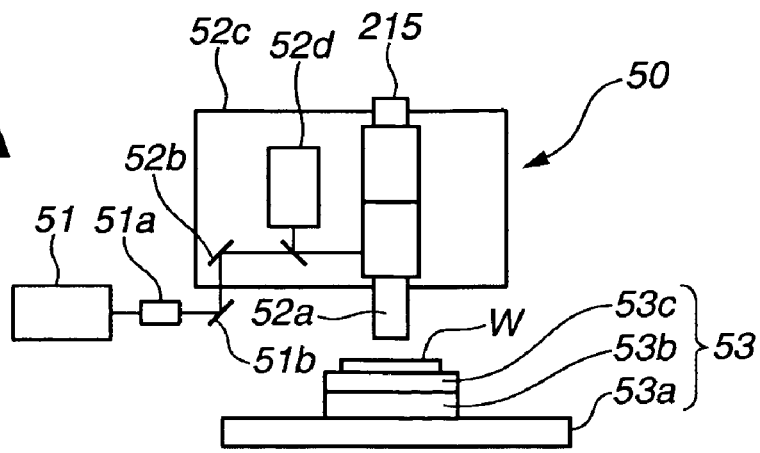

A processing apparatus 50 shown in FIG. 1A includes a light source optical system, a beam-condensing optical system, and an automatic stage mechanism 53. The light source optical system includes a light source 51, a beam expanding system 51a, and a mirror 51b. The beam-condensing optical system includes a microscope objective lens 52a, a mirror 52b, and an automatic focusing mechanism 52c. The automatic stage mechanism 53 includes an X stage 53a, a Y stage 53b, and a fine adjusting stage 53c.

Furthermore, the light source 51 can be a pulse laser (e.g., YAG laser) having a fundamental wavelength (e.g., 1,064 nm for a YAG laser), with a various pulse widths (e.g., ranging from about 15 ns to about 1000 ns) and associated frequencies (e.g., ranging from 10 kHz to 100 kHz).

Figure 1B:
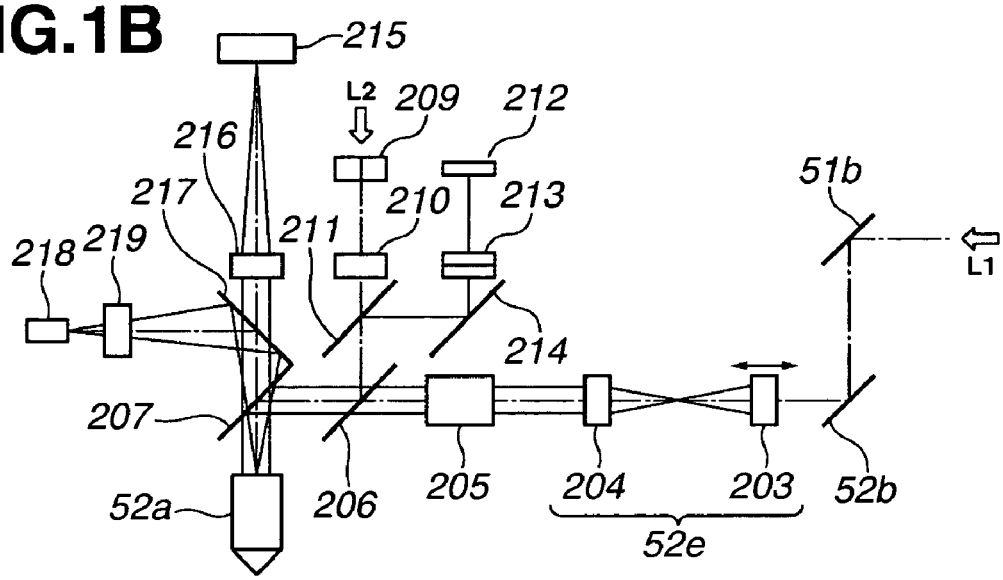
Figure 1C:
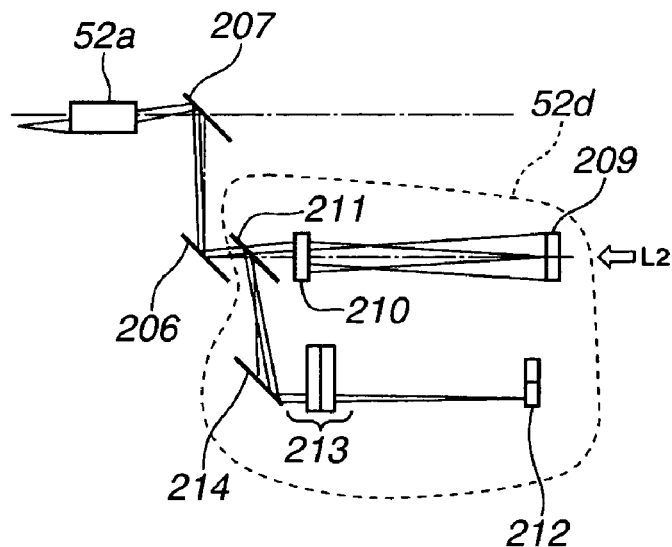

FIG. 1B illustrates a schematic diagram showing details of the beam-condensing optical system, the automatic focusing optical system, and the observing optical system of the processing apparatus 50. FIG. 1C illustrates a schematic diagram showing further details of the automatic focusing optical system. Note that although in the non-limiting examples that follow a YAG laser is discussed, exemplary embodiments are not limited to YAG lasers and any appropriate laser can be used.

In FIG. 1B, a laser beam L1 is a YAG laser (used as a processing laser) and a laser beam L2 is an automatic focusing laser. The processing laser beam L1, being a YAG laser in this non-limiting example, is successively reflected by the mirrors 51b and 52b, before passing through an afocal optical system 52e, which can include a set of lens units 203 and 204. The two mirrors 51b and 52b can have movements independent from each other. For example, the mirror 52b can make a fine movement in association with other optical elements.

The afocal system 52e, when a light flux enters the lens unit 203 in parallel with its optical axis, causes the light flux to exit out of the lens unit 204 along its optical axis. The lens unit 203 can finely move in the optical axis direction. The fine movement of the lens unit 203 makes it possible to control (i.e., change) the angle of the light flux exiting out of the lens unit 204 in both a converging direction and a diverging direction.

With this arrangement, one can control the beam-condensing position of the laser beam L1 (when the laser beam L1 is condensed on a laser beam receiving surface or to an inner portion located at an arbitrary depth beneath the laser beam receiving surface). The laser beam L1 exiting out of the lens unit 204 passes through a correcting lens 205 and a set of dichroic mirrors 206 and 207 and reaches the objective lens 52a. The objective lens 52a condenses the laser beam L1 at the center of a visual field.

The observing optical system can be arranged (configured) in such a manner that the light emitted from an illuminating light source 218 can pass through a lens 219, a half mirror 217, and the dichroic mirror 207 successively. Subsequently, the light passes through the objective lens 52a and illuminates the substrate surface (i.e., a surface to be processed). An emitting surface of the illuminating light source 218 and an entrance pupil of the objective lens 52a are in a conjugated relationship, and accordingly in at least one exemplary embodiment the Koehler illuminating system can be configured.

The objective lens 52a and an image-forming lens 216 cooperatively constitute an infinite microscope system. Due to the function of these lenses, an image receiving surface (e.g., that of a camera 215) is in a conjugated relationship with a laser beam receiving surface of the substrate surface. Namely, it is possible to observe, for example with the camera 215, the irradiation of the laser beam receiving surface by the YAG laser beam when it is used as the processing laser beam L1. In this case, laser beam reflectance of an observation object can be taken into consideration. In this manner, in view of the relationship that the laser beam receiving surface of the substrate surface is conjugate with the camera 215, there is a possibility that the camera 215 can be damaged if the reflectance of the laser beam receiving surface is inappropriate when the microscopic processing operation using the processing laser beam L1 is performed. To reduce any camera damage, at least one exemplary embodiment places a filter between the objective lens 52a and the image-forming lens 216 to trap or absorb the processing laser beam L1. For example, a highly refractive member such as silicon has a reflectance of approximately 30%. Therefore, applying the laser processing operation to a silicon substrate can increase the possibility of damaging the camera 215. Thus some exemplary embodiments have a filter and others may not.

A focal position of the processing laser beam L1 via the objective lens 52a is disposed to be conjugate with a beam-condensing point formed by the lens unit 203 of the afocal optical system 52e (i.e., an image with respect to the incident light flux formed by the lens unit 203). Therefore, finely moving the lens unit 203 along its optical axis direction makes it possible to change or adjust the beam-condensing position of the processing laser beam L1 formed by the objective lens 52a. In other words, this system can be arranged in such a manner that the beam-condensing position of the processing laser beam L1 formed by the objective lens 52a can be controlled by changing the power of the afocal optical system 52e.

The afocal optical system 52e in at least one exemplary embodiment can be arranged by using two lenses (e.g., lens units 203 and 204). However, it is possible to use three or more lens units for arranging the above optical system.

Furthermore, at least one exemplary embodiment can use the automatic focusing mechanism 52c, thus the objective lens 52a can be equipped with an optical system that the laser beam receiving surface of the laser beam L1 being condensed by the objective lens 52a is in a conjugated relationship with the camera 215.

The automatic focusing mechanism 52c can adjust a focus by moving the entire optical system, which can include the objective lens 52a, the image-forming lens 216, and the camera 215. Furthermore, in at least one further exemplary embodiment the focus adjustment can be facilitated with a very small displacement of the objective lens 52a, thus the objective lens 52a can be moved while both of the image-forming lens 216 and the camera 215 can be fixed.

This is can be independent from the arrangement of the beam-condensing point adjusting mechanism of the processing laser beam L1 according to which the lens unit 203 of the afocal optical system 52e is shifted along the optical axis direction.

According to at least one exemplary embodiment, an automatic focusing optical system 52d shown in FIG. 1C can be used to measure the distance between the objective lens 52a and the surface to be irradiated and to perform the automatic focusing adjustment for the beam-condensing optical system and the observing optical system.

This automatic focusing adjustment enables an optical system having a different beam-condensing structure to perform the position setting of the image observed by the camera 215 (i.e., the laser beam receiving surface of the substrate surface) as well as the setting of the beam-condensing position of the processing laser beam L1 (i.e., the internal processing position inside the workpiece).

In at least one exemplary embodiment, the beam-condensing adjustment of each optical system is carried out in the following manner.

First of all, a focus adjustment of the observing optical system is performed by the automatic focusing mechanism 52c that causes the objective lens 52a to shift relative to the laser beam receiving surface of the substrate surface. Then, a beam-condensing position adjustment is performed by utilizing the power change of the afocal optical system 52e to condense the processing laser beam L1 at a desired processing position on or beneath the surface of a workpiece, while the positional relationship (distance) between the laser beam receiving surface and the objective lens 52a is maintained.

The automatic focusing optical system 52d will be described next with reference to FIG. 1C. The following automatic focusing method includes detection of a laser beam L2 reflected from the laser beam receiving surface, based on a signal from a sensor 212, to measure the distance between the laser beam receiving surface and the objective lens 52a. In this respect, this method is different from that of a focus adjustment that obtains an optimum position by defocusing the image on an observation surface which is, for example, obtained by the camera.

In this case, based on the obtained measured data, all of the optical elements but the mirror 51b (i.e., the beam-condensing optical system, the observing optical system, and the automatic focusing optical system) can be shifted close to or away from the laser beam receiving surface (i.e., the workpiece) for example by using an actuator.

With this shift movement, the beam-condensing position of the processing laser beam L1 changes. Accordingly, the shift amount of the optical elements caused by the automatic focusing adjustment can be used to calculate the shift amount of the lens unit 203 of the afocal optical system 52e to hold the beam-condensing position of the processing laser beam L1.

Then, based on this shift amount, the afocal optical system 52e is controlled in such a manner that the beam-condensing position of the processing laser beam L1 is kept stable regardless of execution of the automatic focusing adjustment.

First, the laser beam L2 from a light source is split into four light fluxes. Although there are some methods for splitting the laser beam into a plurality of light fluxes, the method used in at least one exemplary embodiment is a wave front division method that includes usage of a fly-eye lens 209. At the focal position of the fly-eye lens 209, four spots being in mutually symmetrical relationship are formed around the optical axis of the laser beam L2. These spot images are projected on the laser beam receiving surface of the workpiece by an infinite microscope system constituted by an image-forming lens 210 and the objective lens 52a.

Figure 1D:
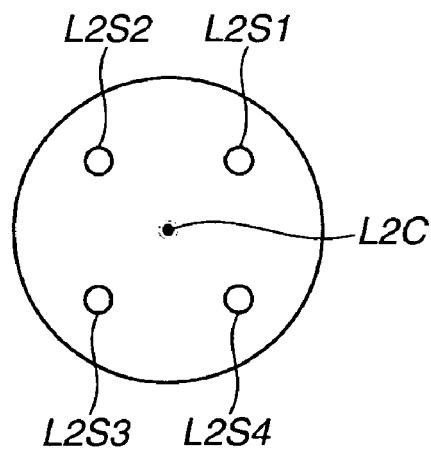

FIG. 1D illustrates a schematic diagram showing the spots of the laser beam L2 on the laser beam receiving surface. The spot positions on the laser beam receiving surface, formed by four split light fluxes of the laser beam L2 used for the automatic focusing adjustment, are disposed in such a manner that four spots L2S1 to L2S4 are present in the visual field at the laser beam receiving surface (corresponding to the processing surface when the surface is an object to be processed). Note that exemplary embodiments are not limited to four spots and thus at least one exemplary embodiment uses either more or less than four spots.

More specifically, these spots L2S1 to L2S4 are positioned in 1st, 2nd, 3rd and 4th quadrants, respectively, when a circle is dissected into four quadrants about its center corresponding to the optical axis L2C that is the optical axis of the laser beam L2. Accordingly, no spot is present on the center L2C of the visual field (corresponding to the optical axis position of the laser beam L2 used for the automatic focusing adjustment and also corresponding to the optical axis position of the processing laser beam L1). In at least one further exemplary embodiment a shape or spot passing through the center L2C can be used.

The light flux reflected from each of the four spots on the laser beam receiving surface (i.e., the processing surface) reaches the sensor 212 after passing through the dichroic mirrors 207 and 206, mirrors 211 and 214, and a lens 213. The lens 213 is a combination lens which can include a spherical lens 213a and a cylindrical lens 213b (FIGS. 2A and 2B). An image obtained by the lens 213 can also be taken by the camera 215.

FIGS. 2A and 2B illustrate schematic diagrams explaining an astigmatism method using the combination lens 213 which can include the spherical lens 213a and the cylindrical lens 213b. It is now assumed that the optical axis direction is an X axis. And, two axes substantially perpendicular to the optical axis and also substantially perpendicular to each other are a Y axis and a Z axis. As the cylindrical lens 213b is added to the lens 213, the combination lens 213 has power on the XY plane and no power on the XZ plane. The image-forming position on the XY plane is different from the image-forming position on the XZ plane. In other words, astigmatism is generated.

When a screen is placed at the position B of FIGS. 2A and 2B along the YZ plane so as to be substantially perpendicular to the optical axis, an approximate circular image is formed. This image formation becomes an ellipse having its minor axis in the Z-axis direction at the position A of FIG. 2B having a focus in the XZ plane, and becomes an ellipse having its minor axis in the Y-axis direction at the position C of FIG. 2A having a focus in the XY plane.

When the sensor 212 is disposed at the position B, four spot images each being substantially circular can be obtained. However, the shape of four spot images on the screen fixed at the B position respectively deforms from a circle to an ellipse in accordance with variation in the distance between the laser beam receiving surface and the optical system. Accordingly, the changes in the major axis and the minor axis of respective ellipses enable predicting the positional relationship between the laser beam receiving surface and the focal position obtained after displacement.

Hence, an eccentricity of the ellipse of each spot is obtained by applying moment calculation to the spot image, thereby obtaining a deviation between the laser beam receiving surface and the focal point of the optical system caused by the displacement.

In this manner, by detecting a distortion of a point image formed by the optical system having astigmatism, it becomes possible to realize a non-contact method for measuring a displacement of the laser beam receiving surface in the optical axis direction. Additionally the above method can be used to determine tilting of the laser beam receiving surface with respect to the optical axis of the optical system. For example if all the spots have different elliptical shapes then one can summarize that the surface is tilted away from being substantially perpendicular to the optical axis of the optical system.

This operation is feasible when the stage 53 is shifting, and is also feasible when the stage 53 is stopped. When stage 53 is shifting, a duty cycle of the automatic focusing adjustment is determined based on a stage shifting speed and a signal processing time. According to at least one exemplary embodiment, the operation is performed at the intervals of about 2 mm to about 10 mm. Usually, based on the focal positions at four positions, the processed surface (i.e., the laser beam receiving surface) is plane-approximated (e.g., by using the least squares method), thereby calculating a gradient of a plane and an offset value from an optimum focal position.

If the moment calculation includes 0-order and primary moment calculations, it is possible to express, (e.g., by using a vector expression), the deviation of the center of four spots (i.e., the centroid of centroids) relative to the reference positions when the centroid position of each spot is obtained beforehand in its image plane. Thus, the gradient of a processed surface can be calculated.

Then, according to at least one exemplary embodiment, all of the optical elements but the mirror 51b (i.e., the beam-condensing optical system, the observing optical system, and the automatic focusing optical system) can be shifted by the actuator to move closer to or away from the laser beam receiving surface (i.e., the workpiece) by the obtained offset value.

At least one exemplary embodiment includes the following optical system. First, the image receiving surface of the camera 215 of the observing optical system is in a conjugated relationship with the beam-condensing position of the laser beam L2 on the substrate surface formed by the objective lens 52a (i.e., the laser beam receiving surface of the substrate surface). Furthermore, the sensor 212 of the automatic focusing optical system 52d is in a conjugated relationship with the beam-condensing position of the laser beam L2 on the substrate surface formed by the objective lens 52a (i.e., the laser beam receiving surface of the substrate surface).

Moreover, the beam-condensing position of the objective lens 52a is in a conjugated relationship with the image of the incident light flux formed by the lens unit 203 of the afocal optical system 52e in the beam-condensing optical system. In at least one exemplary embodiment, these relationships are substantially maintained, and it is possible to employ such an apparatus arrangement that can shift the objective lens 52a to perform the automatic focusing adjustment.

In this case, the shift movement of the focal position by the automatic focusing adjustment of the objective lens 52a can restore the relationship between the sensor 212 of the automatic focusing optical system 52d and the focal position of the objective lens 52a (i.e., the laser beam receiving surface of the substrate surface) to an improved conjugated relationship. Furthermore, the relationship between the image receiving surface of the camera 215 in the observing optical system and the focal position of the objective lens 52a can be also restored to an improved conjugated relationship.

Moreover, the beam-condensing optical system can be arranged in such a manner that the movement of the lens unit 203 can restore the relationship between the image of an incident light flux formed by the lens unit 203 and the beam-condensing position of the objective lens 52a shifted by the automatic focusing adjustment to an improved conjugated relationship. According to at least one exemplary embodiment, only the objective lens 52a is used for the automatic focusing adjustment, thus, one can quickly accomplish the automatic focusing adjustment.

Here, in a case where the laser beam receiving surface is a polished silicon substrate which is the example used as a semiconductor substrate, little consideration will be necessary for the gradient of the laser beam receiving surface. More specifically, the visual field of a microscope is narrow (e.g., $\phi$0.02 mm to 0.5 mm). The flatness of a polished surface is in the level of several μm. The gradient is neglectable in this range.

Therefore, the gradient is regarded as a reference value. If its value increases, it is determined that polishing is insufficient. Furthermore, there is a possibility that some of the data obtained from the four spots are missing or invalid. In such a case, an average value of effective data is calculated. The obtained average value is then used as an offset value in the shifting operation to cause the optical system to move closer to or away from the laser beam receiving surface with the actuator.

Although the detection on the laser beam receiving surface is performed (e.g., by using four spots of four light fluxes split by the fly-eye lens 209), it is possible to determine the gradient of the laser beam receiving surface by using at least three detection data. Accordingly, the total number of split light fluxes in at least one exemplary embodiment can be at least three. Furthermore, if there is no adverse influence of the gradient in the visual field, it is sufficient to use one or two detection positions.

The fly-eye lens 209 is not limited to a combination of single lenses. Therefore, a diffractive optical element can be used. Furthermore, it is possible to employ a method for obtaining detection data at a plurality of positions by changing the detection position within a data input time of the sensor 212.

Furthermore, a 4-split photo diode or other element can be used for detection of astigmatism.

At least one exemplary embodiment brings about improved effects in the system to more accurately perform the automatic focusing adjustment in a case where the material surface is processed (e.g., deformed, softened, or melted on the surface, or changed in the crystal structure) at the optical axis position of the emitted light flux.

Therefore, at least one exemplary embodiment can be applied to any workpiece when its surface is processed or its internal portion is processed, or when the workpiece is cut.

Hereinafter, a laser processing apparatus according to at least one exemplary embodiment will be described with reference to the attached drawings. The laser processing apparatus according to at least one exemplary embodiment is configured to perform substrate cutting for a silicon wafer formed in a predetermined lattice pattern (e.g., that include numerous inkjet head chips)on a silicon substrate surface, by beam-condensing a processing laser beam inside the substrate to form an internal processing region, (e.g., a crack), in the substrate.

Figure 3:
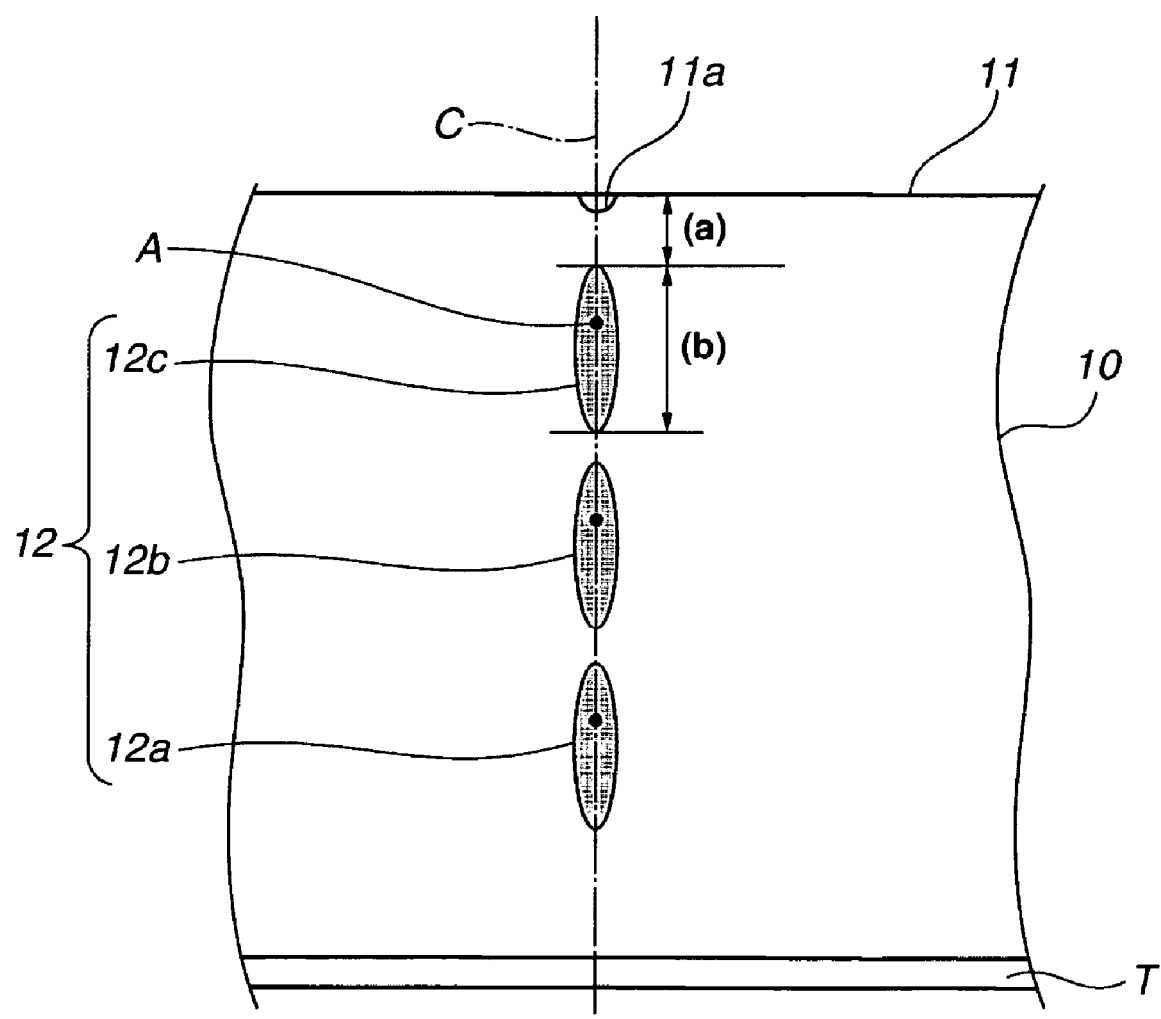
FIG. 3 illustrates a schematic diagram showing cracks generated inside the substrate in accordance with at least one exemplary embodiment.

According to at least one exemplary embodiment, as shown in FIG. 3, the beam-condensing point of the laser beam can be positioned inside the substrate, at a predetermined depth from the substrate surface 11, to form an internal processing region (e.g., the region causing a melted portion, crack, or change in crystal structure) being spaced from the substrate surface 11. According to at least one exemplary embodiment, a plurality of internal cracks 12 (12a to 12c) are formed.

In this case, for the purpose of using one objective lens to simultaneously perform the laser processing operation performed at a predetermined position inside the substrate and the automatically focused surface observation, the apparatus is configured where the beam-condensing position adjustment for the laser processing operation and the automatic focusing adjustment for the surface observation can be independently adjustable.

With this configuration, both the laser processing position and the observation position can be arbitrarily set. This facilitates the apparatus performing an internal processing operation with a laser beam to form internal processing regions beneath the substrate surface along a predetermined cutting line.

Furthermore, the apparatus can use an afocal optical system for the optical system that is configured to use a processing laser beam to form internal processing regions. The afocal optical system causes a lens constituting the afocal optical system to shift in an optical axis direction of the optical system so as to change the power of the afocal optical system. Furthermore, the afocal optical system can change the angle of an emitted laser beam so that the beam-condensing position of the laser beam can be arbitrarily set inside the substrate.

Figure 4C:
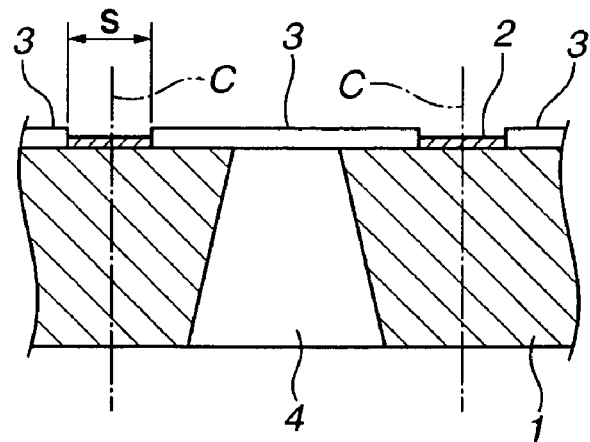

FIGS. 4A and 4B illustrate a silicon substrate 10 having a thickness of 625 μm. As shown in FIG. 4C, a film 2 (e.g., oxide) having a thickness of approximately 1 μm is formed on the crystal surface of a silicon wafer 1. A nozzle layer 3, disposed on the silicon wafer 1, can be an epoxy resin structural body that includes an ink or liquid discharge mechanism, a logic element for driving this mechanism, and its wiring. These members cooperatively constitute each logic element portion 10a. Note that the logic element portion 10a can constitute a different array of elements and exemplary embodiments are not limited to what are included in the examples of a logic element portion 10a. For example exemplary embodiments are not limited to silicon substrates, nor to a particular thickness of the substrate. Additionally exemplary embodiments are not limited to an "oxide" layer and can be any other type of layer appropriate for the designed purpose as known by one of ordinary skill in the relevant art and equivalents. Likewise exemplary embodiments are not limited to logical element portions 10a that include an ink or liquid discharge mechanism.

In the example discussed with respect to at least one exemplary embodiment, a liquid supply port (i.e., ink supply port) 4, serving as an opening portion, can be formed by applying anisotropic etching to the silicon wafer 1, so that the liquid supply port 4 is positioned beneath the nozzle layer 3 incorporating the liquid discharge mechanism as described above. The nozzle layer 3 is disposed between two predetermined cutting lines C so that the silicon wafer 1 can be cut into a plurality of element chips in the final stage of the manufacturing process. Each predetermined cutting line C is formed along a crystal orientation of the silicon wafer 1. A clearance S between neighboring nozzle layers 3 can be set to various values (e.g., set to be at least 400 μm).

FIG. 5 illustrates a flowchart explaining a cutting process for cutting the substrate (e.g., silicon substrate) into a plurality of logic element portions 10a each serving as an individual element chip. The cutting process shown in this flowchart includes a total of 7 processes including a tape mounting process S1, a wafer correcting process S2, a linear surface-processing process S3 (i.e., surface processing process), an internal crack forming process S4 (i.e., internal processing region forming process), a cutting process S5, a repair process S6, and a pickup process S7, which are performed in this order.

As shown in FIG. 6, the silicon substrate 10 is first subjected to the tape mounting process S1 for preventing the elements from being separated before the cutting process S5. The tape mounting process S1 includes a step of bonding a dicing tape T on the back surface of the silicon substrate 10. The dicing tape T can be an adhesive member on which a dicing frame M is attached.

The dicing tape T can be, for example, an adhesive tape on which an ultraviolet curing type or pressure-sensitive type adhesive agent is coated, or an adhesive tape having an autohesion layer.

The nozzle layer 3, (e.g., a resin layer formed on the surface of the silicon substrate 10 as described above), can have heat shrinkage when it is cured. Accordingly, the entire body of the silicon substrate 10 may be deformed as shown in FIG. 7A. If a later-described laser irradiation is applied to the deformed silicon substrate 10, it is difficult to accurately perform the processing operation because the incident angle of a laser beam on the substrate surface 11 is different depending on the position of the substrate surface. Therefore, in at least one exemplary embodiment the deformation is reduced beforehand. Hence, as illustrated in FIG. 7B, a suction stage D is placed behind the dicing tape T to pull the silicon substrate 10 by vacuum or decreased pressure so that the silicon substrate 10 is substantially flattened from the deformed condition.

Subsequently, to accurately cut the silicon substrate 10 into a plurality of logic element portions 10a, a surface-processing trace 11a (refer to FIG. 8) is formed on the oxide layer surface 11b along the predetermined cutting line C to trigger propagation of a crack. More specifically, forming the surface-processing trace 11a along the predetermined cutting line C is effective to apply a concentrated stress along the predetermined cutting line C when an external force for cutting is applied in a later process. Accordingly, a crack is led to the surface-processing trace 11a. Otherwise, the surface-processing trace 11a becomes a start point of the crack propagation advancing inward. Therefore, a reduced amount of unnecessary cracks will appear and accordingly the logic circuits will be more protected from being damaged.

The surface-processing trace 11a can be formed by drawing a line along the predetermined cutting line C, as illustrated in FIG. 8, (e.g., with a scriber using a machining tool 40, such as a superhard cutting head or a diamond cutter blade). In at least one exemplary embodiment, the surface-processing trace 11a can have various dimensions, for example, it can have a width equal to or larger than 2 μm and a depth equal to or larger than 1 μm. However, the surface-processing trace 11a can not interfere with the light path of a laser beam L1 that is used for formation of the internal crack 12. The processing depth is set to an appropriate value so that a concentrated stress can be surely applied between the surface-processing trace 11a and the crack in the cutting process. In at least one exemplary embodiment, the processing depth is set somewhere within a chosen range, and it is acceptable that the processing depth is shorter than the thickness of the oxide film 2, which is a surface layer on the silicon substrate 10, as illustrated in FIG. 8. Alternatively, the processing depth can be equal to or longer than the thickness of the oxide film 2.

Furthermore, although the surface-processing trace 11a is shown used on one side of the substrate surface 11 having logic element portions 10a, the surface-processing traces 11a can be formed on both the front surface 11 and the back surface of the silicon substrate 10.

Furthermore, in a case where the surface-processing trace 11a is formed by a scribing machine equipped with a machining tool, at least one exemplary embodiment enables the reduction of any unnecessary cracks from being generated when a processing load is applied, because the surface-processing trace 11a can be formed before internal cracks are formed. Furthermore, forming such a surface-processing trace beforehand facilitates the surface-processing trace being utilized as a reference (i.e., line) indicating the processing position for the laser irradiation in a later process. Thus, the work efficiency of the laser irradiation can be improved.

Furthermore, it is possible to form the surface-processing trace 11a after the internal crack forming process using the laser beam L1 is accomplished. In this case, the internal crack formation can be efficiently performed because there is no substantial influence of the vignetting of a laser beam during the internal crack formation (i.e., the influence that a laser beam reaching the inside of the substrate decreases because of the phenomenon that an inclined surface of the surface-processing trace 11a undesirably reflects the laser beam).

The selection of a laser beam is determined with reference to a spectral transmission factor of the substrate. Therefore, at least one exemplary embodiment uses light in a predetermined wavelength region that can form a strong electric field in a beam-condensing point and is permeable into a substrate.

Furthermore, when the refractivity of a substrate is taken into consideration, the microscope objective lens 52a of the beam-condensing optical system can be a beam-condensing lens that is suitable for processing the inside of a substrate, for example a silicon substrate 10, and can be used for microscopic observation of the substrate surface.

The optical conditions in performing the internal processing operation can be set in such a manner that the surface-processing trace 11a can be present anywhere on the substrate surface 11. More specifically, in at least one exemplary embodiment the power is increased in consideration of the energy loss of the processing laser beam L1 if such a loss is caused by the surface-processing trace 11a, or a light flux can be selected that can enter the inside of the substrate without interfering with the surface-processing trace 11a. In this manner, the light flux entering via the substrate surface 11 can cause a refraction in the silicon substrate 10 and is condensed at a beam-condensing point A spaced by a predetermined depth (a) from the substrate surface 11 so as to form the internal crack 12 (refer to FIG. 3).

According to at least one exemplary embodiment one can set processing conditions considering the beam-condensing position, the film arrangement of the oxide film 2, or the wavelength of a laser beam used, so that the crack edge of an uppermost internal crack 12c shown in FIG. 3 is spaced by a chosen distance (e.g., the distance of about 10 μm or more) from the substrate surface 11. This setting facilitates efficient operation because, if such processing conditions are not satisfied, the internal crack 12c may merge with the substrate surface 11 during the processing operation, or the substrate surface 11 maybe damaged if laser irradiation conditions are improper.

The depth (a) of the beam-condensing point A can be controlled by shifting either a workpiece W (i.e., the silicon substrate 10) or the laser beam condensing optical system (i.e., the processing optical system for forming an internal processing region with a laser beam) in the optical axis direction, so that the beam-condensing position A can be changed. However, in observing the laser beam receiving surface on the substrate surface, at least one exemplary embodiment employs an arrangement where the lens unit 203 of the afocal optical system 52e belonging to the laser beam condensing optical system can be shifted along the optical axis direction.

When 'n' represents the refractivity of the silicon substrate 10 relative to the laser wavelength (e.g., 1064 nm) and 'd' represents a mechanical shift amount (i.e., the shift amount of either the silicon substrate 10 or the laser beam condensing optical system when it is shifted in the optical axis direction), an optical shift amount of the beam-condensing point A can be expressed by a product of 'n' and 'd' (i.e., nd). The refractivity 'n' of the silicon substrate 10 is approximately 3.5 relative to the wavelength 1.1 μm to 1.5 μm. The comparison with an experimentally measured refractivity value has revealed that 'n' is close to 3.5. Namely, when the mechanical shift amount is 100 μm, the beam-condensing point of the laser beam is formed in a position at the depth of 350 μm from the substrate surface.

Furthermore, having the refractivity of approximately 3.5 is equivalent to having a large reflectance. In general, where the reflection in the vertical incidence is expressed by $((n-1)/(n+1))^2$, the silicon substrate has the reflectance of approximately 30%. Theoretically, the rest of the energy can reach the beam-condensing point inside the silicon substrate. However, if the light absorption by the silicon substrate itself is taken into consideration, the final energy available at the beam-condensing point will be smaller than that. According to an experimental measurement using a silicon substrate having a thickness of 625 μm, the transmission factor was approximately 20%.

When the laser beam L1 is condensed at the beam-condensing point A, an internal processing region where the silicon substrate material locally changes is formed. According to at least one exemplary embodiment, the silicon substrate 10 causes a change in its crystal condition at the beam-condensing portion. As a result, the internal crack 12 appears. Although it depends on a stress applied to the beam-condensing point A, the internal crack 12 can appear in both the direction approaching toward and the direction going away from the substrate surface through which the laser beam L1 enters the inside of the substrate (i.e., in the depth direction of the substrate surface). The crack length (b) can vary (e.g., approximately 2 μm to 100 μm).

In this manner, the internal crack 12 is formed from one point inside the silicon substrate 10. The internal processing operation can be performed, just beneath the predetermined cutting line C, by relatively shifting the beam-condensing point A along the predetermined cutting line C in the plane parallel to the substrate surface.

As described above, at least one exemplary embodiment includes an optical system equipped with the laser beam condensing position adjusting mechanism for condensing the laser beam L1 at an arbitrary position inside the substrate to form an internal processing region. Furthermore, the laser beam condensing position adjusting mechanism can include the objective lens 52a and the afocal optical system 52e including the lens units 203 and 204. Furthermore, the arrangement of at least one exemplary embodiment includes the correcting lens 205 and the mirror (i.e., dichroic mirror) 207. Furthermore, it is possible to further add the light source 51, the beam expanding system 51a, and the mirrors 51b and 52b, although they are not directly related to the laser beam condensing position adjustment.

Furthermore, the optical system for observing the substrate surface can include the automatic focusing mechanism 52c, the observation beam emitting system, the objective lens 52a, the image-forming lens 216, and the camera 215. The automatic focusing mechanism 52c can be configured where the entire optical system including the objective lens 52a, the image-forming lens 216, and the camera 215 can be displaced in both the direction approaching toward and the direction going away from the substrate 10 being the workpiece W. The observation beam emitting system in at least one exemplary embodiment includes the light source 218, the illuminating lens 219, and the half mirror 217.

The workpiece W (e.g., the silicon substrate 10) can be mounted on the automatic stage 53, which is shiftable in the X and Y directions. Therefore, the positional adjustment of the workpiece W in the X and Y directions is feasible. On the other hand, to realize the positional adjustment of the workpiece W in the optical axis direction (i.e., the depth direction or the Z direction), it is possible to employ an arrangement configured to facilitate shifting the automatic stage 53 with the workpiece W mounted thereon in the Z direction.

At least one exemplary embodiment uses the automatic focusing mechanism 52c, serving as the Z stage, which is shiftable in the Z direction to adjust the distance between the objective lens 52a and the workpiece W. The shift movement of the automatic focusing mechanism 52c enables the apparatus of at least one exemplary embodiment to simultaneously drive the optical system including the afocal optical system 52e and the objective lens 52a and the optical system including the objective lens 52a and the camera 215 taking an observation image.

Next, the internal processing operation (i.e., the operation for forming an internal processing region inside the substrate) using the laser beam L1 will be described.

First, as illustrated in FIG. 4A, the predetermined cutting lines C formed on the silicon substrate 10 include two kinds of predetermined cutting lines C(C1) and C(C2) that are substantially perpendicular to each other. The predetermined cutting line C(C1) is substantially parallel to an orientation flat 10b formed as a reference on the silicon substrate 10. The predetermined cutting line C(C2) can be substantially normal to the orientation flat 10b. In starting the processing operation, following points can be considered.

As illustrated in FIG. 9, the laser processing operation starts from the end point of the silicon substrate 10 being the workpiece W. In this case, the region near the end point is generally difficult to process compared with the central region. Hence, the processing conditions can be changed so as to increase the laser energy when the region near the end point is processed. In this case, according to the arrangement of at least one exemplary embodiment, a plurality of, e.g., 4, spots of automatic focusing measurement are set in the peripheral region of the visual field, except the central region of the observation visual field of the laser beam receiving surface where the processing laser beam L1 is emitted in a concentrated manner. Therefore, at least one exemplary embodiment performs the beam-condensing of the laser beam L1 at an arbitrary position inside the substrate, while observing the surface near the end point on an in-focus image plane.

Furthermore, in a case where the substrate is cut into a plurality of chips (e.g., rectangular) as illustrated in FIG. 10, to surely separate these rectangular chips, the predetermined cutting line C1 extending along the longer side of the chip is regarded as a first cutting direction and the internal crack 12 can be formed substantially along this line C1. Then, the internal crack 12 is formed substantially along the predetermined cutting line C2 extending along the shorter side of the chip, which is regarded as a second cutting direction. In this case, according to the arrangement of at least one exemplary embodiment, the automatic focusing adjustment can be appropriately performed, even when the laser beam receiving portion is not a flat surface due to irradiation of the processing laser beam L1 which can be emitted with a narrowed light flux onto the predetermined cutting lines C1 and C2.

More specifically, this is because at least one exemplary embodiment employs such an arrangement that the measuring laser beam L2 for the automatic focusing adjustment is emitted as spots surrounding the light flux of the processing laser beam L1. Furthermore, the arrangement of at least one exemplary embodiment, facilitates performing a processing operation while contemporaneously attaining the beam-condensing of the processing laser beam L1 at an arbitrary position inside the substrate. Additionally performing the focus adjustment for observing the substrate surface. Namely, according to at least one exemplary embodiment, the laser beam L1 can be condensed at an internal processing region positioned at an arbitrary depth in the substrate, while the processing operation in the visual field of a chosen order (e.g., of a mm order or less) is visually confirmed.

As described above, the crack length formed at one beam-condensing point can be of various lengths (e.g., in the range from 2 μm to 100 μm). Meanwhile, the silicon substrate can have various thicknesses (e.g., 625 μm). Hence, repeatedly performing the internal processing operation facilitates the complete cutting of silicon substrate 10. Furthermore, regarding the order of the internal processing operation performed at one point, the internal processing operation can start with the far side (i.e., inner side) and end with the near side close to the substrate surface.

Furthermore, during the internal processing operation for forming internal cracks, at least one exemplary embodiment performs the processing operation in such a manner that an internal crack formed adjacent to the substrate surface can not reach the substrate surface having the surface-processing trace 11a. Furthermore, the processing conditions can be carefully determined to reduce the occurrence of the internal crack already existing in the vicinity of the beam-condensing point from developing due to laser irradiation heat and reaching the substrate surface.

However, the above condition may not be applied to the inner side of the substrate. As illustrated in FIG. 3, it is acceptable to discretely form a plurality of internal cracks 12a to 12c disposed in the depth direction. Alternatively, it is acceptable that the internal cracks 12a to 12c merge with each other. Furthermore, the uppermost internal crack 12c closest to the substrate surface 11 is positioned at a chosen depth (e.g., of 10 µm to 100 µm) from the substrate surface 11 of the silicon substrate 10. In addition, the internal crack 12c is not connected with the surface-processing trace 11a.

The processing order of each crack group will be described next.

Figure 11A:
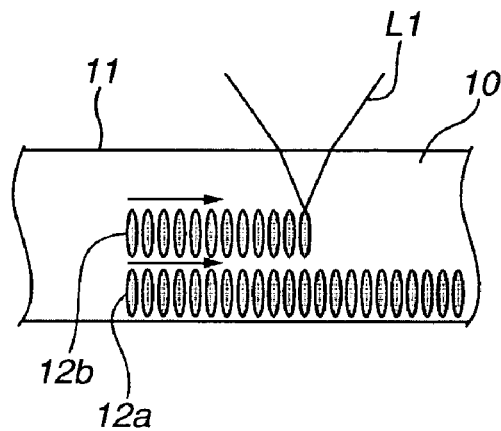
Figure 11C:
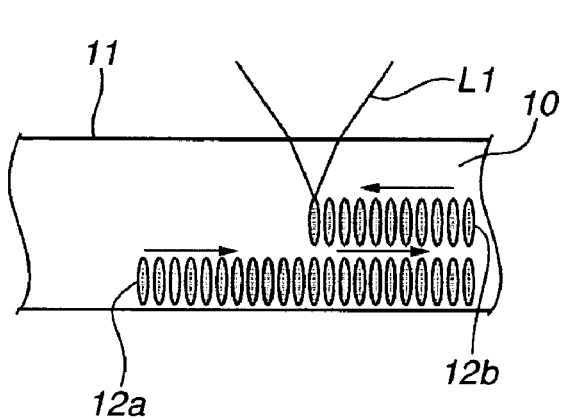
Figure 11B:
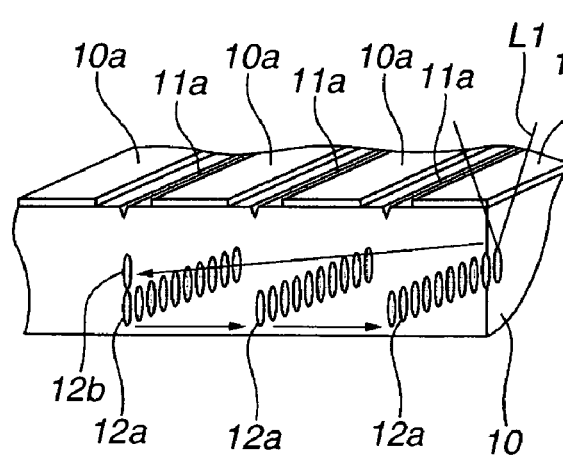

A first method includes, steps applied to a plurality of or all of predetermined cutting lines C, a step of forming a crack group of internal cracks 12a positioned at substantially the same depth and subsequently forming another crack group of internal cracks 12b positioned at a different depth, as shown in FIGS. 11A, 11B, and 11C. According to the first method, forming each crack group of the same depth is successively carried out inside the silicon substrate 10. Thus, the influence given by neighboring predetermined cutting lines C can be reduced.

Figure 11D:
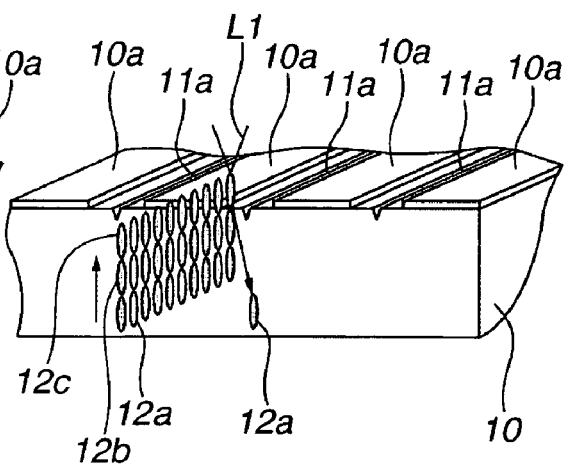

A second method includes a step of forming a crack group of internal cracks 12a, 12b, and 12c sequentially provided at different depths inside the substrate beneath one predetermined cutting line C and subsequently forming a similar crack group along another predetermined cutting line C, as shown in FIG. 11D. The second method can reduce the total number of times of the automatic focusing operation which is applied to the substrate surface at the processing start point, for example where improvement of the focal position with respect to the flatness of the silicon substrate 10 is desired.

Furthermore, the first method can be carried out in such a manner that the beam-condensing point is shifted in the same direction along the predetermined cutting line as shown in FIG. 11A, or can be carried out in such a manner that the beam-condensing point is shifted in both the forward and backward directions along the predetermined cutting line as shown in FIG. 11C. In the latter mode, a total shifting distance is short and, accordingly, the processing time can be shortened.

Although at least one exemplary embodiment employs the latter mode, determination of the mode can be done considering the conditions of an object (e.g., flatness, undulation, or other conditions of the substrate).

In any case, when a laser processing operation is carried out, the arrangement of at least one exemplary embodiment can be used to perform observation of a laser beam receiving surface at any position on the XY plane under the condition that the focal point is automatically adjusted on the laser beam receiving surface even if the substrate surface is not flat. Therefore, shifting of the laser beam irradiation position can be accurately performed along the predetermined cutting line within the XY plane. In addition, under the condition that the focal point for the observation is adjusted on the laser beam receiving surface, the laser beam L1 can be condensed at an internal processing portion at an arbitrary depth of the substrate. Thus, the fine processing operation as shown in FIGS. 11A to 11D can be performed with an accuracy of an order of µm.

As illustrated in FIG. 10, two predetermined cutting lines C1 and C2, having two cutting directions, intersect at a point (i.e., a crossing point C12). In the area in the vicinity of the crossing point C12, an internal processing zone formed along the first cutting direction blocks the laser light flux for an internal processing operation performed along the second cutting direction at the same depth. This phenomenon is limited to a local area and does not appear entirely in the internal processing zone extending in the second cutting direction.

However, considering the energy loss, the processing conditions can be changed when the processing point is close to the crossing point C12. Additionally, the processing conditions can be changed when the laser beam shifts in the second cutting direction so that the processing operation performed along the second cutting direction can be performed under the processing conditions different from those of the processing operation performed along the first cutting direction. Even in such a processing operation, the arrangement of at least one exemplary embodiment can be used to accurately perform formation of an internal processing region at an arbitrary depth of the substrate under the condition that the position of the crossing point C12 is accurately observed.

According to at least one exemplary embodiment, in the silicon substrate 10 in which the surface-processing trace 11a and a plurality of internal cracks 12a, 12b, and 12c are formed along each predetermined cutting line C, the surface-processing trace 11a is not connected with the internal crack 12c positioned beneath the substrate surface. Therefore, at the time immediately after the laser processing operation is accomplished, the logic element portions 10a of the silicon substrate 10 are not cut yet. Hence, cutting the silicon substrate 10 into a plurality of element chips is next carried out in the following manner.

After the formation of the surface-processing trace 11a and the internal crack 12 is accomplished, the silicon substrate 10 is placed upside down on an elastic rubber sheet, (e.g., a silicon rubber or a fluorocarbon rubber), of the cutting apparatus while the silicon substrate 10 is mounted on the dicing tape T. Next, the operation for cutting the silicon substrate 10 into element chips is carried out by applying a pressing force to the silicon substrate 10 via the dicing tape T with a stainless roller or other mechanism for pressing as would be known by one of ordinary skill in the relevant art.

As a result, the crack generation (or development) starts from the surface-processing trace 11a and propagates inside the substrate via the sequentially arrayed internal cracks 12a, 12b, and 12c formed with the laser irradiation, and finally reaches the back surface of the substrate. Thus, the silicon substrate 10 can be cut along the predetermined cutting line C1. Although the crack propagation (or development) appears along a crystal orientation of the silicon substrate 10, the cutting occurring in the substrate is substantially governed by the connection between the surface-processing trace 11a and the internal crack 12. Thus, an actual cut line does not largely deviate from the predetermined cutting line C1 on the substrate surface 11.

As described above, according to at least one exemplary embodiment, a distance measurement can be performed even in a case where it has been deemed inappropriate for the use of reflected light flux to designate a distance measuring reference position. Furthermore, even in an apparatus using a shared objective lens to emit both the processing laser beam and the focus adjusting laser beam onto a light receiving region, at least one exemplary embodiment enables the apparatus to perform the laser processing operation while appropriately carrying out the automatic focusing adjustment.

While the present invention has been described with reference to an exemplary embodiment, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2004-335396 filed Nov. 19, 2004, which is hereby incorporated by reference herein in its entirety.

What is claimed is:

1. A laser processing apparatus adapted to irradiate a workpiece with a processing laser beam to process the workpiece, the laser processing apparatus comprising:

a first optical system configured to emit a focus adjusting laser beam to a laser beam receiving surface of the workpiece, and to provide light paths of a plurality of light fluxes as the focus adjusting laser beam where the plurality of light fluxes are simultaneously positioned around an optical axis of the first optical system when the laser beam is incident on the laser beam receiving surface;

a second optical system configured to guide the plurality of light fluxes reflected from the laser beam receiving surface to a photo-sensitive unit that detects the reflected plurality of light fluxes;

a third optical system configured to irradiate the laser beam receiving surface of the workpiece with the processing laser beam;

a fourth optical system configured to observe the laser beam receiving surface;

an objective lens shared by the first optical system, the second optical system, the third optical system, and the fourth optical system, and located to face the laser beam receiving surface; and an output unit configured to output information relating to beam-condensing conditions of the plurality of light fluxes condensed on the laser beam receiving surface, based on the plurality of light fluxes reflected from the laser beam receiving surface and detected by the photo-sensitive unit.

2. The laser processing apparatus according to claim 1, wherein the processing laser beam from the third optical system irradiates a position of the laser beam receiving surface corresponding to the center of the optical axis of the first optical system.

3. The laser processing apparatus according to claim 1, wherein a focus adjustment relative to the laser beam receiving surface for the third optical system is performed based on the information outputted from the output unit.

4. The laser processing apparatus according to claim 3, wherein the third optical system performs a focus adjustment of the processing laser beam relative to the laser beam receiving surface by changing an angle of a light beam emerging from an afocal optical system provided in a light path of the third optical system.

5. The laser processing apparatus according to claim 4, wherein the afocal optical system includes a lens that is shiftable in an optical axis direction of the light path of the third optical system to change the angle of the light beam emerging from the afocal optical system.

6. The laser processing apparatus according to claim 1, wherein a focus adjustment of the fourth optical system relative to the laser beam receiving surface is performed based on the information outputted from the output unit.

* * * * *